United States Patent
Kamo et al.

[11] Patent Number: 6,151,695
[45] Date of Patent: Nov. 21, 2000

[54] TEST METHOD OF CHIPS IN A SEMICONDUCTOR WAFER EMPLOYING A TEST ALGORITHM

[75] Inventors: Yoshitaka Kamo; Hiroaki Tosa; Tatsushi Higashi; Akihiro Kuroda, all of Tokyo, Japan

[73] Assignee: Mitsubishi Denki Kabushiki Kaisha, Tokyo, Japan

[21] Appl. No.: 09/126,736

[22] Filed: Jul. 31, 1998

[30] Foreign Application Priority Data

Feb. 13, 1998 [JP] Japan ................... 10-030932

[51] Int. Cl.⁷ .................................... G01R 31/28
[52] U.S. Cl. .................. 714/734; 714/734; 714/741
[58] Field of Search ................. 714/724, 734, 714/738, 741, 725, 25, 31, 32, 33, 35, 37; 707/517

[56] References Cited

U.S. PATENT DOCUMENTS 5,440,720  8/1995  Baisuck et al. ................ 395/500
5,586,046  12/1996  Feldbaumer et al. ........... 364/490
5,621,653  4/1997  Yuzawa ........................ 364/491

FOREIGN PATENT DOCUMENTS 60-42664   6/1985   Japan .
5-267417   10/1993  Japan .
8-274139   10/1996  Japan .

*Primary Examiner*—Trinh L. Tu
*Attorney, Agent, or Firm*—McDermott, Will & Emery

[57] ABSTRACT

Sample chips are tested after determining the chip layout on a semiconductor wafer so that one or plural ones of untested chips are surrounded by plural ones of the sample chips that adjoin the untested samples. A good/defective judgment on the untested chips is performed by using predicted good/defective judgment results that are statistically predicted based on results of the sample test and stored statistical data of a defect generation profile including address information that indicates defective chip locations. As a result, the good/defective judgment can be performed with high accuracy even in a case where defective chips are localized in a particular region on the wafer in a concentrated manner.

8 Claims, 7 Drawing Sheets

FIG. 3

| judgement subject chips (untested chips) | number of sample chips that surround or adjoin judgement subject chip (tested chip) | sample test result (number of defective chips) | | | | |
|---|---|---|---|---|---|---|
| | | 0 | 1 | 2 | 3 | 4 |
| | | good/defective judgement rule for judgement subject chips | | | | |
| a | 4 | ○ | ○ | ○ | × | × |
| b | 3 | ○ | ○ | ○ | × | |
| c | 2 | ○ | × | × | | |

○ mark: judgement good
× mark: judgement defective

FIG. 5

| judgement subject chips (untested chips) | number of sample chips that surround or adjoin judgement subject chip (tested chip) | sample test result (number of defective chips) | | | | |
|---|---|---|---|---|---|---|
| | | 0 | 1 | 2 | 3 | 4 |
| | | good/defective judgement rule for judgement subject chips | | | | |
| a | 4 | ○ | ○ | ○ | × | × |
| b | 3 | ○ | ○ | ○ | × | |
| c | 2 | ○ | × | × | | |
| d | 1 | ○ | × | | | |

○ mark: judgement good
× mark: judgement defective

TEST METHOD OF CHIPS IN A SEMICONDUCTOR WAFER EMPLOYING A TEST ALGORITHM

BACKGROUND OF THE INVENTION

1. Field of the Invention

The present invention relates to a wafer test method, for testing chips in a semiconductor wafer, that are used in manufacture of semiconductor devices and, more particularly, to a test method of chips in which a statistical technique is employed in a test algorithm.

2. Background Art

A wafer test method, i.e. a test method of chips in a wafer, in which a good/defective judgment on untested chips is performed after testing of sample chips on a semiconductor wafer, usually employs a sampling test. Such kind of test method is disclosed in, for instance, (a) Japanese Unexamined Patent Publication No. 8-274139, (b) Japanese Unexamined Patent Publication No. 60-42664, or (c) Japanese Unexamined Patent Publication No. 5-267417. In the publication (a), a good chip ratio of a single wafer is determined and a wafer-by-wafer good/defective judgment and a good/defective judgment on a wafer lot are performed based on yield data of test results of sample chips. In the publication (b), good/defective judgments are performed in the same manner as in the publication (a) based on statistical data of past lots, such as characteristic values of respective test items, and reference values. In the publication (c), after the start of skipped monitoring, judgments of test items with which the skipping can be continued are performed by comparing test results of all items of several sample chips per wafer with reference yield values. Since tests on wafers, lots, and test items that have been judged to be good are omitted thereafter, this wafer test method provides an advantage that the test time can be shortened.

The sampling tests of the above-described conventional techniques employ test methods in which a good/defective judgment on untested chips is performed by using the yield that is obtained through averaging with the number of all chips on a wafer or the total chip area and is hence what is called a macroscopic index. Therefore, when defective chips are concentrated in a particular region on a wafer, the accuracy of the good/defective judgment becomes low. This causes a problem that the sampling ratio cannot be reduced.

To investigate a proper method for improving process capabilities in terms of quality assurance of materials, a manufacturing process, and manufacturing facilities that are factors of causing defective chips based on sampling test results, it is necessary to recognize microscopic relative positional relationships between sample chips and untested chips to be subjected to a good/defective judgment. However, a relative positional relationships between sample chips and untested chips to be subjected to a good/defective judgment is not considered in the conventional techniques.

SUMMARY OF THE INVENTION

The present invention has been made to solve the above problems in the conventional art, and a first object of the present invention is to improve the accuracy of a good/defective judgment on untested chips on a semiconductor wafer that is performed based on statistical prediction results, to thereby provide a wafer test method that is high in assured reliability.

A second object of the present invention is to provide a wafer test method capable of performing a wafer test with high efficiently in a short time while maintaining high accuracy of a good/defective judgment on untested chips even for a wafer lot in which defective chips occur in a particular region on a wafer in a concentrated or localized manner.

A third object of the present invention is to provide a wafer test method capable of flexibly altering a test algorithm even during a test of a good/defective judgment on untested chips based on statistical prediction results.

According to one aspect of the present invention, a semiconductor wafer test, i.e. a test of chips in a semiconductor wafer, is performed at a wafer stage for a plurality of chips in a test effective region on a wafer. The sample chips are subjected to a sample test respectively, while the judgment subject chips are subjected to a good/defective judgment test based on a test algorithm after the sample test of the sample chips. Further, in the test algorithm, (a) a chip layout rule determines the layout of the sample chips and the judgment subject chips so that the judgment subject chips are adjoined or surrounded by the sample chips by assigning respective chip address to each chip that indicate the location on the wafer, and by determining the chip layout based on statistical data of a defect generation distribution (or defect generation profile) including address information of defective chips that have occurred in the test effective region. (b) A sample test rule determines a procedure of the sample test to be performed on the sample chips. (c) A good-defective judgment rule, for judging the judgment subject chips, is determined based on good/defective judgment prediction that are statistically deducted from both the statistical data and good/defective test results of the sample chips.

In another aspect, in the test method, the chip layout rule determines the chip layout so that one or adjacent ones of the judgment subject chips are surrounded by or interposed between the sample chips.

In another aspect, in the test method, the chip layout rule determines the chip layout so that the number of the sample chips is smaller than or approximately equal to the number of the judgment subject chips.

In another aspect, in the test method, the chip layout rule determine the chip layout so that a plurality of sample chips are located in an outermost region of the test effective region to surround the plurality of the judgement subject chips.

In another aspect, in the test method, further in the test algorithm, (d) a good chip confirmation test rule prescribes a procedure of a good chip confirmation test for checking whether the judgment subject chips that have been judged good are actually good chips by subjecting the judgment subject chips to the same test as the sample test. In addition or alternatively, (e) a defective chip confirmation test rule determines whether a confirmation should be made that the judgment subject chips that have been judged defective are actually defective chips by subjecting the judgment subject chips to the same test as the sample test, or the judgment subject chips should finally be judged defective without subjecting to the further test.

In another aspect, in the test method, the statistical data of the defect generation distribution (or defect generation profile) includes test data of the wafer test including addresses and good/defective test results of the sample chips, and addresses, good chip confirmation test results and defective chip confirmation test results of the judgment subject chips, and data of specifications for materials, designs, manufacture, qualities, and manufacturing facilities of the chips.

In another aspect, in the test method, the test algorithm is configured so that test data that are newly obtained during execution of the wafer test can be fed back to the test algorithm so far accumulated, and that the statistical data of the defect generation distribution, the chip layout rule, the sample test rule, and/or the good/defective judgment rule can be modified.

In another aspect, in the test method, the test algorithm is defined in such a manner that a total number of tests on a single wafer including the number of sample tests and the number of good chip confirmation tests and defective chip confirmation tests on the judgment subject chips does not exceed a total number of chips existing in the test effective region.

Other and further objects, features and advantages of the invention will appear more fully from the following description.

BRIEF DESCRIPTION OF THE DRAWINGS

FIG. 3 shows a relationship between test results of sample chips and good/defective judgment rules for judgment subject chips.

FIG. 5 shows another relationship between test results of the sample chips and good/defective judgment rules for the judgment subject chips

BEST MODE OF CARRYING THE INVENTION

Figure 1:
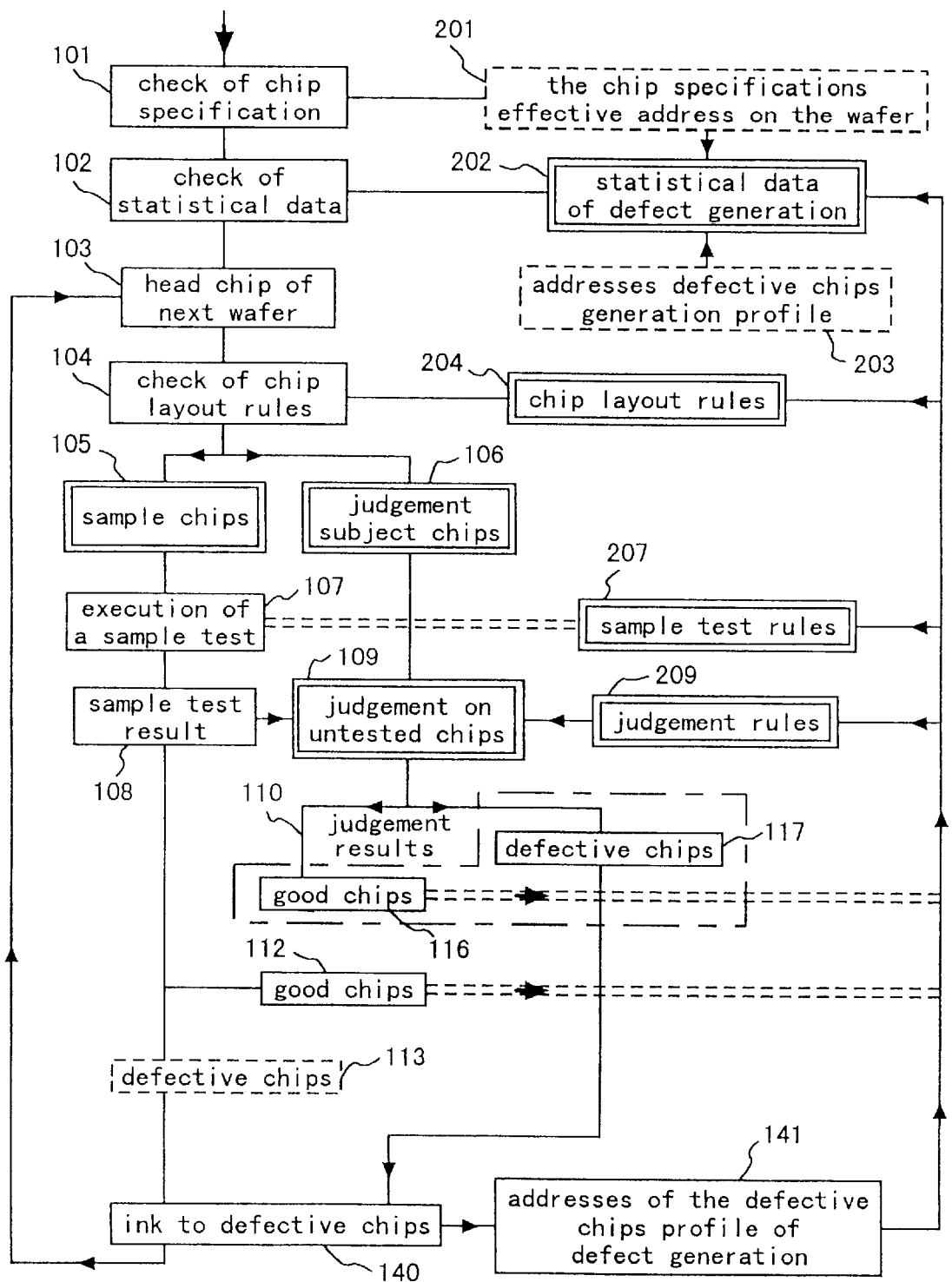
FIG. 1 is a process flow chart showing a wafer test method and system for semiconductor chips using a statistical technique according to a first embodiment of the present invention.
Figure 2A:
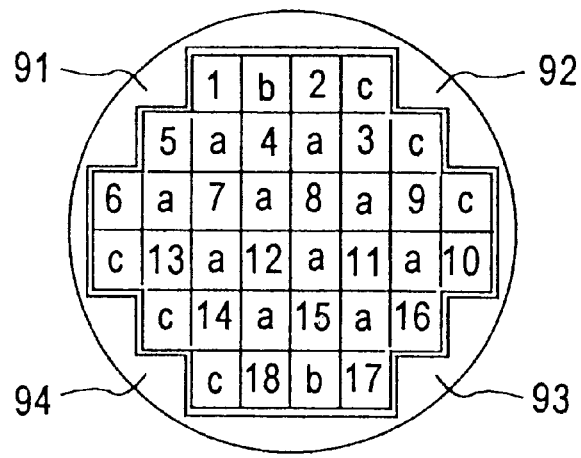
FIGS. 2A and 2B show positional relationships between sample chips and judgment subject chips.
Figure 2B:
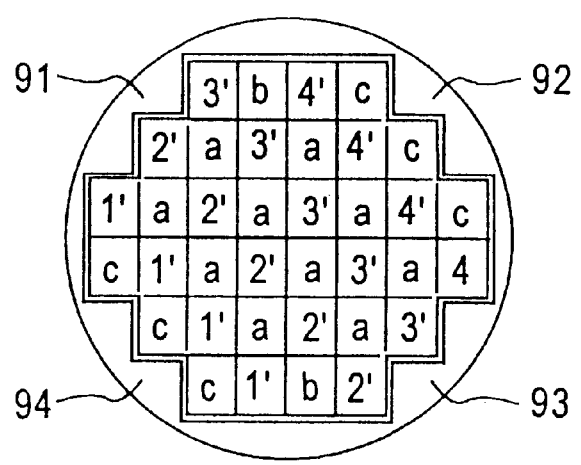

The embodiments of the present invention will be hereinafter described with reference to the accompanying drawings. The same reference symbols in the drawings represent the same or equivalent items.
First Embodiment FIG. 1 is a process flow chart which shows a wafer test method, i.e. a test method of chips in a wafer, and a system for conducting a test using a statistical technique according to a first embodiment of the present invention. FIGS. 2A and 2B show positional relationships between sample chips and judgment subject chips. FIG. 3 shows a relationship between test results of sample chips and good/defective judgment rules for judgment subject chips.

In FIGS. 2A and 2B, reference numeral 91 denotes a wafer to be tested and numeral 92 denotes a wafer peripheral region that is not suitable for a wafer test because it is difficult for that region to provide chips having satisfactory quality. Reference numeral 93 denotes a test effective region. Addresses corresponding to chip locations are given to the respective ones of a number of chips existing in the region 93, and a wafer test is performed on only the chips having an address. Reference numeral 94 denotes the boundary between the regions 92 and 93.

FIGS. 2A and 2B schematically show cases where thirty six chips (36 chips) are formed on the test effective region 93; FIG. 2A corresponds to a case where sample chips are sequentially tested one by one, and FIG. 2B corresponds to a case where 4 sample chips are tested simultaneously. Chips 1–18 and 1'–4' are sample chips to be subjected to a sample test, and chips 'a'–'c' are judgment subject chips which are untested and on which a good/effective test is performed after the sample test. The cases of FIGS. 2A and 2B are the same in that the chips are arranged in such a manner that each of the judgment subject chips 'a'–'c' is individually surrounded or adjoined by a plurality of (i.e., 2–4) sample chips.

Next, a process flow and a test algorithm of a wafer test will be described with reference to FIG. 1 and FIGS. 2A–2B.

In the process flow shown in FIG. 1, reference numeral 101 denotes a check of chip specifications; 102, a check of statistical data; 103, the head chip of the next wafer; 104, a check of chip layout rules; 105, sample chips; 106, judgment subject chips; 107, execution of a sample test; 108, sample test results; 109, a good/defective judgment on untested chips; 110, good/defective judgment results of the judgment subject (i.e., untested) chips; 112, test-good chips; 113, test-defective chips; 116, judgment-good chips; and 117, judgment-defective chips. Further, reference numeral 140 denotes ink application to the test-defective chips; 141, addresses of the defective chips and a profile of defect generation; 201, the chip specifications and effective address on the wafer; 202, statistical data of the defect generation profile; 203, the addresses and the generation profile of the defective chips; 204, chip layout rules; 207, sample test rules; and 209, good/defective judgment rules for the judgment subject chips.

After the start of the wafer test and before sampling of test chips, the check 101 of wafer and chip specifications and the check 102 of statistical data of defective chips are performed as shown in FIG. 1. The chip quality in the test effective region 93 shown in FIGS. 2A and 2B strongly depends on various specifications for materials, designs, a manufacturing process, and qualities of a wafer and chips that relate to the steps preceding the wafer test as well as the process capabilities in terms of quality assurance of the manufacturing facilities. Further, it is frequently the case that defective chips are concentrated in a particular chip forming region, i.e., a particular address region. For the above reasons, the check 101 of specifications and the check 102 of statistical data are necessary.

The chip layout rules 204 prescribe the chip layout of the sample chips 105 and the judgment subject chips 106 as well as a sampling method.

The sample test rules 207 prescribe test items, test conditions, test order, etc. Chip layout rules 204 and sample test rules 207 most suitable for the test of this time can also be selected from among many kinds of stored rules that have been determined based on the wafer and chip specifications and the statistical data of defective chips as test results.

FIGS. 2A and 2B show sampling examples in which the sample chips 1–18 or 1'–4' are arranged every other chip so as to surround or adjoin the judgment subject chips 'a'–'c'. In the case of FIG. 2A, tests are performed 18 times in total on only the sample chips 1–18 on the wafer in order of the reference numerals, i.e., 1→2→3 ... 17→18, starting from a predetermined chip position. On the other hand, in the case of FIG. 2B, four sample chips 1'–4' are tested simultaneously and hence the wafer test on a single wafer is finished when tests have been performed five times.

After the end of the test, good/defective judgment results of the judgment subject chips that have not been subjected to the tests can be predicted statistically by synthesizing the good/defective results 108 of the sample chips (see FIG. 1) that are now known, the known defective chip statistical data 203, the above-mentioned chip layout rules 204 and sample test rules 207, and other factors. The good/defective judgment rules 209 for the judgment subject chips (see FIG. 1) are determined based on this statistically predicted good/defective judgment results.

The relative positional relationships between the tested sample chips and the untested judgment subject samples greatly affect the accuracy of the statistically predicted good/defective judgment results. That is, the degree of adjacency or closeness between the two kinds of chips, specifically the addresses of the two kinds of chips and the number of sample chips adjoining each judgment subject chip, is a very important factor. This has been proved by past statistical data of analyses on the correlation between sample test results and a profile of defect-generated addresses of judgment subject chips.

As in the case of the defective chip statistical data, the chip layout rules 204, and the sample test rules 207, good/defective judgment rules 209 (see FIG. 1) most suitable for the test of this time can be selected from among many kinds of stored rules that have been determined based on the wafer and chip specifications and the defective chip statistical data as test results.

FIG. 3 shows good/defective judgment rules that are selected in the above-described manner for a good/defective judgment on the judgment subject chips 'a'–'c' (18 chips in total) of FIGS. 2B and 2B.

The good/defective judgment rules will be described below with reference to FIG. 3. For example, in a case where, as in the case of the untested chips 'a', four tested chips (test results are known) adjoin and surround each chip 'a', chip 'a' is judged defective if the test results of the four surrounding chips are such that three or more chips are defective, and is judged good if less than three surrounding chips are defective. This judgment rule is applied to all of the ten (10) untested chips 'a'.

As for the untested chips 'b' and 'c' that are within the address effective region 93 and adjacent to the boundary line 94, an good/defective judgment is performed based on test results of three or two chips adjoining each chip 'b' or 'c'. Specifically, in the case of chips 'b' that are adjoined by three tested chips, chip 'b' is judged defective if all of the three chips are defective, and otherwise it is judged good. In the case of chips 'c' that are adjoined by two tested chips, chip 'c' is judged defective if one or more of the two chips are defective, and otherwise it is judged good. These judgment rules are applied to all of the two untested chips 'b' and six untested chips 'c'.

Again referring to FIG. 1, the test-defective chips 113 in the sample test results 108 and the judgment-defective chips 117 that have been determined by the good/defective judgment 109 on the untested chips are finally judged to be defective chips and ink is applied thereto at the step of the ink application 140. These chips will be handled as defective chips. The wafer test on the one wafer is completed when the ink application 140 is finished, and a transition to a test on the head chip 103 of the next wafer is made.

The data of the defective chips are fed back, as the newly acquired data 141 of the defective chip addresses and the defect generation profile, to the statistical data 202 so far accumulated. Further, as indicated by arrows ("↑," "←," etc.) in FIG. 1, the data of the defective chips are also fed back to the chip layout rules 204, the sample test rules 207, and the good/defective judgment rules 209 in similar manners.

By causing the feedback data to be reflected, the wafer test can be adapted properly. For example, it is possible to apply the good/defective judgment rules of FIG. 3 to the first to third wafers of a lot including 25 wafers and to apply a more intelligent test algorithm than the test algorithm using the good/defective judgment rules of FIG. 3 to the fourth wafer onward.

As described above, the wafer test method of this embodiment is characterized by using the test algorithm in which the chip layout is determined based on statistical data of a defect generation profile including address information of defective chips that have occurred in the test effective region on a wafer so that judgment subject chips are adjoined or surrounded by sample chips, and the good/defective judgment rules for the judgment subject chips are determined based on predicted ill good/defective judgment results that are statistically predicted from the statistical data and good/defective test results of the sample chips.

The wafer test method of this embodiment is also characterized by using the test algorithm the chip layout rules determine the chip layout so that one or adjacent ones of the judgment subject chips are surrounded by or interposed between the sample chips.

The wafer test method of this embodiment is also characterized by using the test algorithm including the chip layout rules that determine the chip layout so that the number of sample chips is smaller than or approximately equal to the number of judgment subject chips.

Second Embodiment

Figure 4A:
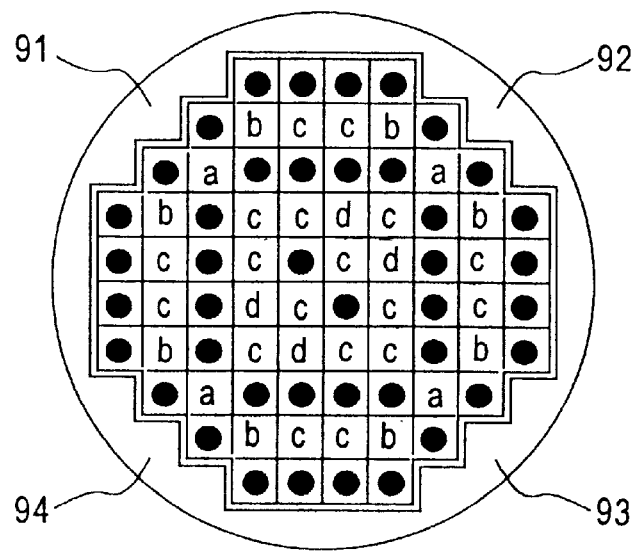
FIGS. 4A and 4B show another positional relationships between sample chips and untested, judgment subject chips for a chip test algorithm using a statistical technique according to a second embodiment of the present invention.
Figure 4B:
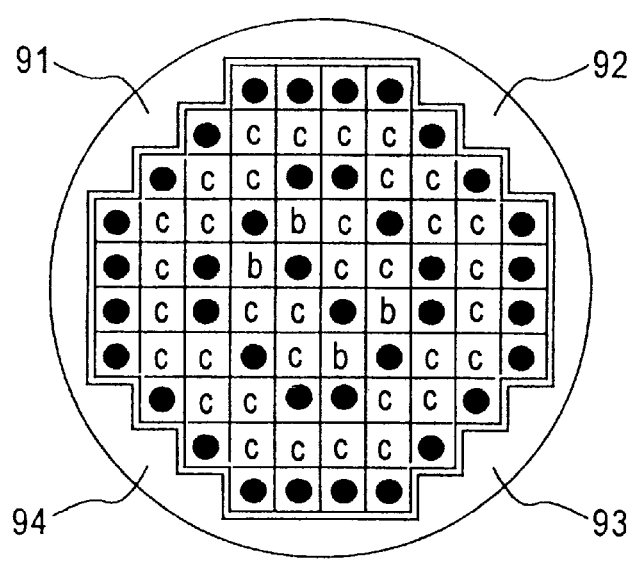

FIGS. 4A–4B and FIG. 5 show a chip test algorithm using a statistical technique according to a second embodiment of the present invention. Specifically, FIGS. 4A and 4B show positional relationships between sample chips and untested, judgment subject chips, and FIG. 5 shows a relationship between test results of the sample chips and good/defective judgment rules for the judgment subject chips. The items in FIGS. 4A–4B and FIG. 5 that are given the same reference symbols as the corresponding items in FIGS. 2A–2B and FIG. 3 (in the first embodiment) are the same as or equivalent to the latter and descriptions therefor will be omitted. This embodiment also refers to the process flow chart of FIG. 1.

The chip layout of FIGS. 4A and 4B is different in the following point from that of FIGS. 2A and 2B in which each of the judgment subject chips 'a'–'c' is surrounded or adjoined by a plurality of (i.e., 2–4) sample chips. That is, FIGS. 4A and 4B show a sampling example in which sample chips (indicated by dark circle marks "●") located in the outermost region of the test effective region 93 completely surround the thirty four (34) or thirty eight (38) judgment subject chips 'a'–'d', and in a central region of the test effective region 93 a part of the sample chips (indicated by dark circle marks "●") surround a plurality of judgment subject chips 'a'–'d' in a ring-like manner. Chip layout patterns of this type have features that they facilitate simultaneous testing of a plurality of chips and improve the accuracy of the good/defective judgment when applied to a wafer in which defective chips are concentrated in a peripheral region of the wafer.

For example, photoresist application in photolithography includes a step of dropping a photoresist onto a rotating wafer that is mounted on a rotary stage. Since the rotation speed is accurately adjusted in consideration of the viscosity of the photoresist, a uniform resist film is formed on the wafer by centrifugal force. However, when the rotation speed varies, specifically decreases, the photoresist is not spread sufficiently and hence a thin resist film for chips in the outermost region of the test effective region 93. The thin resist film may be etched excessively in a subsequent etching step to cause defective chips in a concentrated manner in this region.

The above event is just an example. However, when a defective chip pattern in which defective chips are concentrated or localized in a particular region on the wafer is detected with the sampling method of FIGS. 2A or 2B, switching to the sampling method of FIG. 4A or 4B may be made by using the feedback function of the test algorithm of FIG. 1 for the next wafer onward.

Next, good/defective judgment rules will be described with reference to FIG. 5. FIG. 5 shows good/defective judgment rules that are selected from the good/defective judgment rules 209 of FIG. 1 for a good/defective judgment on the judgment subject chips (34 or 38 chips 'a'–'d' in total) of FIG. 4A or 4B.

The good/defective judgment rules of FIG. 5 is different from those of FIG. 3 in a feature that the former enable judgment of the untested chips 'd' that cannot be judged according to the latter. Specifically, where, as in the case of chips 'd' shown in FIG. 4A, each chip 'd' is adjoined by one tested chip, chip 'd' is judged defective if the one chip is defective, and otherwise it is judged good.

These judgment rules are applied to all of the four untested chips 'd'. Good/defective judgment rules for the untested chips 'a'–'c' are the same as those shown in FIG. 3.

As described above, the wafer test method of this embodiment is characterized by using the test algorithm including the chip layout rules that the chip layout so that a part of the sample chips are located in the outermost region of the test effective region.

Third Embodiment

Figure 6:
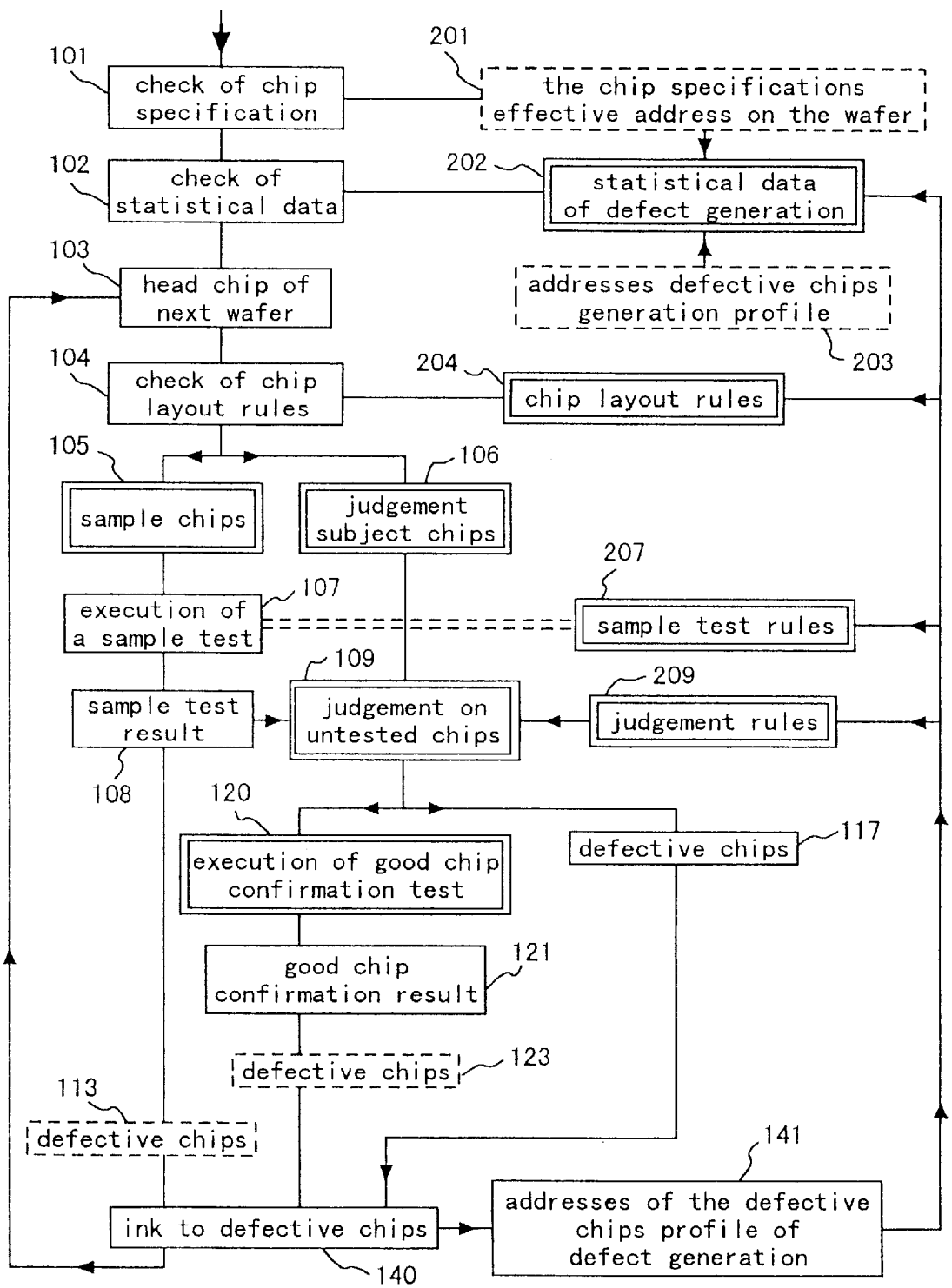
FIG. 6 is a process flow chart showing a wafer test method and system for chips using a statistical technique according to a third embodiment of the present invention.

FIG. 6 is a process flow chart showing a wafer test method and system for chips using a statistical technique according to a third embodiment of the present invention. This embodiment also refers to FIGS. 2A–2B and 4A–4B each showing the positional relationships between the sample chips and the untested, judgment subject chips and FIGS. 3 and 5 each showing the relationship between test results of the sample chips and the good/defective judgment rules for the judgment subject chips (in the first and second embodiments). The items in FIG. 6 that are given the same reference symbols as the corresponding items in FIG. 1 are the same as or equivalent to the latter and descriptions therefor will be omitted.

While the process flow of FIG. 6 is the same as that of FIG. 1 from the beginning to the good/defective judgment 109 on the untested chips, the former is different from the latter in the following point. That is, although in the process flow of FIG. 1 the judgment-good untested chips 116 in the good/defective judgment results 110 are finally judged to be good chips and thereafter kept handled as good chips, the process flow of FIG. 6 has an additional step of execution 120 of a good chip confirmation test for checking whether the judgment-good chips 116 are certainly good chips.

Defective chips 123 in good chip confirmation results 121 are subjected to the ink application 140, and then the wafer test on the one wafer is finished and a transition is made to testing of the head chip 103 of the next wafer. The data of the defective chips 123 are fed back, as the newly acquired test data 141 of the defective chip addresses and the defect generation profile, to the respective rules and the statistical data that constitute the test algorithm.

The fed-back test data of the defective chip addresses and the defect generation profile enables construction of a more intelligent test system that shown in FIG. 1.

As described above, the wafer test method of this embodiment is characterized by the test algorithm including the good chip confirmation test rules for checking whether judgment subject chips that have been judged good are actually good chips by subjecting those judgment subject chips to the same test as performed on the sample chips, and/or the defective chip confirmation test rules for determining whether it should be confirmed that judgment subject chips that have been judged defective are actually defective chips by subjecting those judgment subject chips to the same test as performed on the sample chips, or those judgment subject chips should finally be judged defective and need not be subjected to the test.

Fourth Embodiment

Figure 7:
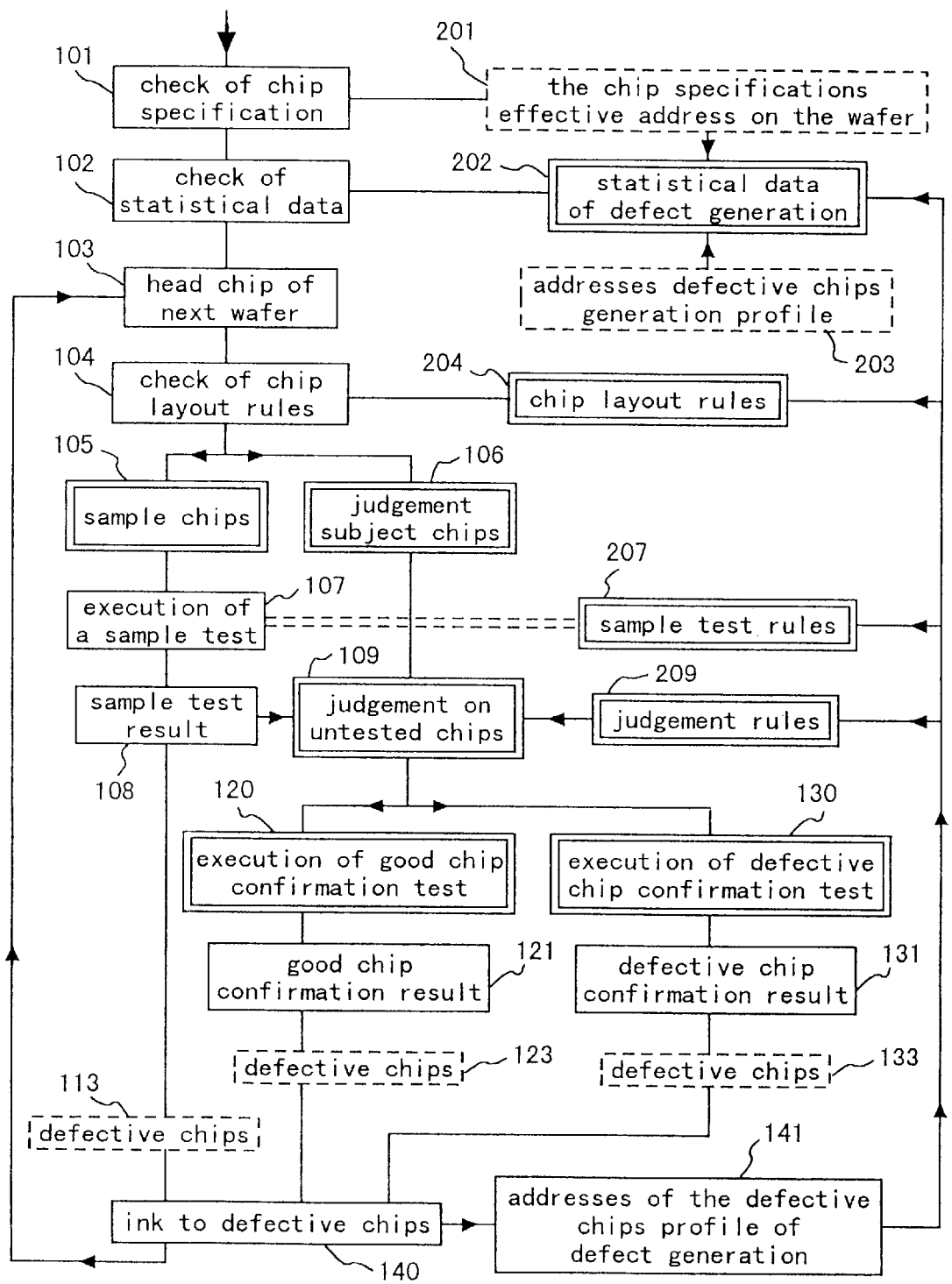
FIG. 7 is a process flow chart showing a wafer test method and system for chips using a statistical technique according to a fourth embodiment of the invention.

FIG. 7 is a process flow chart showing a wafer test method and system for chips using a statistical technique according to a fourth embodiment of the invention. This embodiment also refers to FIGS. 2A–2B and 4A–4B each showing the positional relationships between the sample chips and the untested, judgment subject chips and FIGS. 2 and 5 each showing the relationship between test results of the sample chips and the good/defective judgment rules for the judgment subject chips (in the first and second embodiments). The items in FIG. 7 that are given the same reference symbols as the corresponding items in FIGS. 1 and 6 are the same as or equivalent to the latter and descriptions therefor will be omitted.

While the process flow of FIG. 7 is the same as that of FIG. 6 from the beginning to the ink application 140 to the judgment-defective chips 123 in the good chip confirmation test results 121 of the untested chips and the step 141, i.e., the defective chip addresses and the defect generation profile, the former is different from the latter in the following point. That is, although in the process flow of FIG. 6 the judgment-defective chips 117 that have been judged defective in the good/defective judgment 109 on the untested chips are no longer tested, the process flow of FIG. 7 has an additional step of execution 130 of a defective chip confirmation test for checking whether the judgment-defective chips 117 are certainly defective chips.

Defective chips 133 in defective chip confirmation results 131, i.e., the defectiveness-confirmed defective chips, are subjected to the ink application 140, and then the wafer test on the one wafer is finished and a transition is made to testing of the head chip 103 of the next wafer. The data of the defective chips 133 are fed back, as the newly acquired test data 141 of the defective chip addresses and the defect generation profile, to the respective rules and the statistical data that constitute the test algorithm.

Therefore, the effect of the feedback to the test algorithm in the process flow of FIG. 7 is even larger than in the process flow of FIG. 6. The process flow of FIG. 7 has an advantage that when it is applied to, for instance, the layouts of the sample chips and the judgment subject chips shown in FIGS. 2A–2B and 4A–4B, an intelligent test system in which abundant statistical data of defective chips are accumulated can be constructed in such a manner that the total number of tests including the number of sample tests and the number of good chip confirmation tests and defective chip confirmation tests on the judgment subject chips does not exceed the total number of chips existing in the test effective region, i.e., the total number of tests is equal to the number of tests that would be performed when the sampling ratio is equal to 1. Further, the process flow of FIG. 7 is different from the process flows of FIGS. 1 and 6 in that the former has a remarkable effect of preventing defective chips from being supplied to the downstream steps.

The wafer test method according to each embodiment is characterized by using the test algorithm in which the statistical data of the defect generation profile consists of the wafer test data and the data of the specifications for materials, designs, manufacture, qualities, and manufacturing facilities of chips.

The wafer test method according to each embodiment is characterized by using the test algorithm in which test data that are newly obtained during execution of the wafer test can be fed back to the test algorithms so far accumulated, and the statistical data of the defect generation profile, the chip layout rules, the sample test rules, and/or the good/defective judgment rules can be altered.

The wafer test method according to the fourth embodiment is characterized by the test algorithm that is defined in such a manner that the total number T of tests on a single wafer including the number of sample tests and the number of good chip confirmation tests and defective chip confirmation tests on the judgment subject chips does not exceed the total number N of chips existing in the test effective region.

Being constituted as described above, the present invention provides the following effects and advantages.

By testing sample chips that are arranged so as to be adjacent to or close to judgment subject chips based on the statistical data of a defect generation profile including the address information of defective chips on a wafer, good/defective judgment results of untested chips can be obtained statistically with very high prediction accuracy and reliability.

By testing sample chips that are arranged so that one or adjacent ones of judgment subject chips are surrounded by or interposed between the sample chips, with a minimum number of sampling tests.

By testing sample chips whose number is smaller than or approximately equal to the number of judgment subject chips, the test quality that is highly accurate and highly reliable can further be improved and the test time of a trial wafer lot and a head part of a mass-production lot, in each of which all chips are tested conventionally, can be halved.

Where sample chips are located in the outermost region of the test effective region, a defect generation profile in which defective chips are concentrated in a peripheral portion of a wafer can be detected soon after its occurrence.

By performing the good chip confirmation test and the defective chip confirmation test for checking the appropriateness of good/defective judgment results of judgment subject chips, the number of defective chips that are supplied to the steps downstream of the wafer test can be reduced, whereby total test time of the entire chip manufacturing process can be shortened.

A statistical test algorithm can be constructed by using the statistical data of a defect generation profile that is supported by the address information of defective chips, the defective chip confirmation data, the specifications for chip design and manufacture, and other information. Further, the invention allows investigation of factors that cause defects and quickens elimination of those factors.

Since test data that are newly obtained during execution of a sample test are fed back to statistical data accumulated so far, the statistical data of a defect generation profile can be improved in reliability and the good/defective judgment rules can be made mode intelligent as well as the high test quality can further be improved with a minimized number sampling tests.

Since the total number T of tests on a single wafer is set so as not to exceed the total number N of IC chips inside the effective chip boundary, abundant statistical data of a defect generation profile can be acquired with the same number of tests as in the conventional case in wafer lots of trial and development stages, in which lots all chips are tested conventionally.

It is further understood that the foregoing description is a preferred embodiment of the disclosed device and that various changes and modifications may be made in the invention without departing from the spirit and scope thereof.

What is claimed is:

1. A method for performing a semiconductor wafer test, for testing chips in a semiconductor wafer, performed at a wafer stage; said wafer test being performed on a plurality of predetermined sample chips and on a plurality of judgment subject chips both of which are located in a test effective region on a wafer; said sample chips being subjected to a sample test respectively; said judgment subject chips being subjected to a good/defective judgment test based on a test algorithm after said sample test of said sample chips;

wherein said test algorithm comprises:

(a) a chip layout rule for determining the layout of said sample chips and said judgment subject chips so that said judgment subject chips are adjoined or surrounded by said sample chips by assigning respective chip address to each chip that indicate the location on said wafer, and by determining the chip layout based on statistical data of a defect generation distribution including address information of defective chips that have occurred in said test effective region;

(b) a sample test rule for determining a procedure of said sample test to be performed on said sample chips; and (c) a good-defective judgment rule, for judging said judgment subject chips, determined based on good/defective judgment prediction that are statistically deducted both from the statistical data and good/defective test results of said sample chips.

2. The method according to claim 1, wherein said chip layout rule determines the chip layout so that one or adjacent ones of said judgment subject chips are surrounded by or interposed between said sample chips.

3. The method according to claim 1, wherein said chip layout rule determines the chip layout so that the number of the sample chips is smaller than or approximately equal to the number of the judgment subject chips.

4. The method according to claim 1, wherein said chip layout rule determine the chip layout so that a plurality of sample chips are located in an outermost region of said test effective region to surround a plurality of said judgement subject chips.

5. The method according to claim 1, wherein said test algorithm further comprises:

(d) a good chip confirmation test rule for prescribing a procedure of a good chip confirmation test for checking whether said judgment subject chips that have been judged good are actually good chips by subjecting said judgment subject chips to the same test as said sample test; and/or (e) a defective chip confirmation test rule for determining whether a confirmation should be made that said judgment subject chips that have been judged defective are actually defective chips by subjecting said judgment subject chips to the same test as said sample test, or said judgment subject chips should finally be judged defective without subjecting to the further test.

6. The method according to claim 1, wherein said statistical data of the defect generation distribution includes test data of said wafer test including addresses and good/defective test results of said sample chips, and addresses, good chip confirmation test results and defective chip confirmation test results of said judgment subject chips, and data of specifications for materials, designs, manufacture, qualities, and manufacturing facilities of the chips.

7. The method according to claim 1, wherein said test algorithm is configured so that test data that are newly obtained during execution of said wafer test can be fed back to said test algorithms so far accumulated, and that said statistical data of the defect generation distribution, said chip layout rule, said sample test rule, and/or said good/defective judgment rule can be modified.

8. The method according to claim 1, wherein said test algorithm is defined in such a manner that a total number of tests on a single wafer including the number of sample tests and the number of good chip confirmation tests and defective chip confirmation tests on the judgment subject chips does not exceed a total number of chips existing in said test effective region.

* * * * *